DRIFT STABILIZED AMPLIFIER

Filed June 23, 1961

INVENTOR.
MATTHEW C. ABBOTT
THOMAS H. GRIFFIN
BY F. J. Sullivan
ATTORNEY 3,176,236

DRIFT STABILIZED AMPLIFIER

Matthew C. Abbott, Greenwood, Mass., and Thomas H. Griffin, Tulsa, Okla., assignors to Sylvania Electric Products Inc., a corporation of Delaware Filed June 23, 1961, Ser. No. 119,144
2 Claims. (Cl. 330—25)

This invention is concerned with electronic circuits and particularly with improved signal amplifiers.

A critical requirement for many applications of electronics is a voltage amplifier having a reliable and temperature insensitive means for maintaining a quiescent output voltage, i.e. a stable direct current voltage level about which an alternating current signal swings. In transistorized circuits the quiescent output voltage occurs midway between the supply voltage, $V_{cc}$, and the saturation voltage, $V_s$, of the output amplifying stage, and allows maximum peak-to-peak voltage excursions to pass without distortion. This maximum peak-to-peak signal is, by definition, the difference between the supply voltage and the voltage drop across the output stage under its most conductive condition.

Hitherto, feedback means have commonly been used to obtain voltage bias stability. Current feedback (refer Millman and Taub, "Pulse and Digital Circuits," McGraw-Hill Book Co., Inc., 1956, pp. 5, 6) requires a fairly large feedback resistor, which increases the value of $V_s$ and thus reduces the peak-to-peak maximum undistorted voltage swing. In voltage feedback (refer Millman and Taub, supra, pp. 4, 5) the direct current stability is improved by the use of a small feedback resistor but alternating current voltage gain imposes a limiting factor. Stabilizing components, such as diodes and thermistors, aid in achieving fairly good bias stability; however, it is difficult to match the temperature characteristics of these stabilizing elements with a circuit over a wide temperature range.

Accordingly, a primary object of this invention is to provide an improved amplifier circuit and especially one which generates a correction signal for stabilizing direct current output voltage without significant sensitivity to temperature variations.

These and related objects are accomplished in one illustrative embodiment of the invention by a unique combination of an alternating current source, a direct-coupled amplifier, a filter, a comparator, and a source of reference voltage. The direct-coupled amplifier amplifies the signal from the alternating current source and transfers it to the filter for removal of the alternating current component and the emission of a direct current voltage level. The comparator then subtracts this voltage from the reference source voltage, and feeds back the inverted difference to the amplifier.

Other objects, features, and embodiments of the invention will be apparent from the following description of this illustrative embodiment and reference to the accompanying drawing, wherein.

Figure 1:
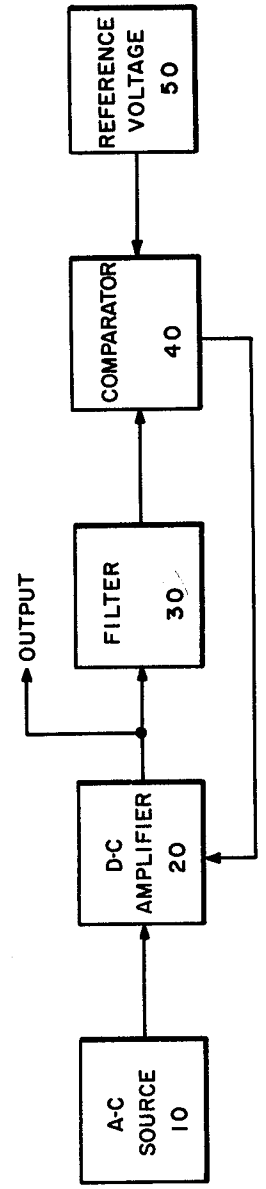
FIG. 1 is a block diagram of an amplifier utilizing the invention.

The amplifier bias stabilization circuit of FIG. 1 comprises an alternating current source 10, a direct-coupled amplifier 20, a filter 30, a comparator 40, and a reference voltage source 50. The output direct current voltage level, $V_o$, of amplifier 20 is used to produce a correction signal which is fed back to the input of the amplifier. Hitherto, means were used to adjust the circuit input or individual stages within the amplifier for obtaining a particular quiescent output voltage. On the other hand, since the voltage against which the quiescent output voltage, $V_o$, of this invention is referenced is obtained from the supply voltage, $V_{cc}$, any variation in supply voltage will result in the output voltage automatically adjusting itself to the center value. This is shown by the following:

$$V_o=\frac{V_{cc}+V_s}{2}$$

if $$V_s<<V_{cc}$$

then $$V_o=\frac{V_{cc}}{2}$$

considering supply drift of $\pm V_{cc}$ then $$V_o=\frac{V_{cc}+\Delta V_{cc}}{2}$$

Consequently, output voltage, $V_o$, will increase or decrease by a factor of $\Delta V_{cc}/2$ as supply voltage, $V_{cc}$, increases or decreases by $\Delta V_{cc}$. No undesirable reduction in alternating current gain or peak-to-peak output voltage is obtained.

Amplifier 20 is a standard direct-coupled device with a voltage gain value of $|A|$. If alternating current source 10 applies an alternating current signal $e_{in}$ to amplifier 20, an alternating current output $|A|e_{in}$ is produced about direct current output level $V_o$. This output is then transferred to direct current R-C filter 30, where the alternating current components are removed and direct current level $V_o$ is emitted. This is compared in standard comparator 40 to a reference voltage from source 50 so that a comparator output equal to the difference between $V_o$ and the reference voltage is produced. This output, representing the amount of drift in amplifier 20, is fed back in a negative sense to compensate for the drift and thus achieve bias stability in the amplifier.

Figure 2:
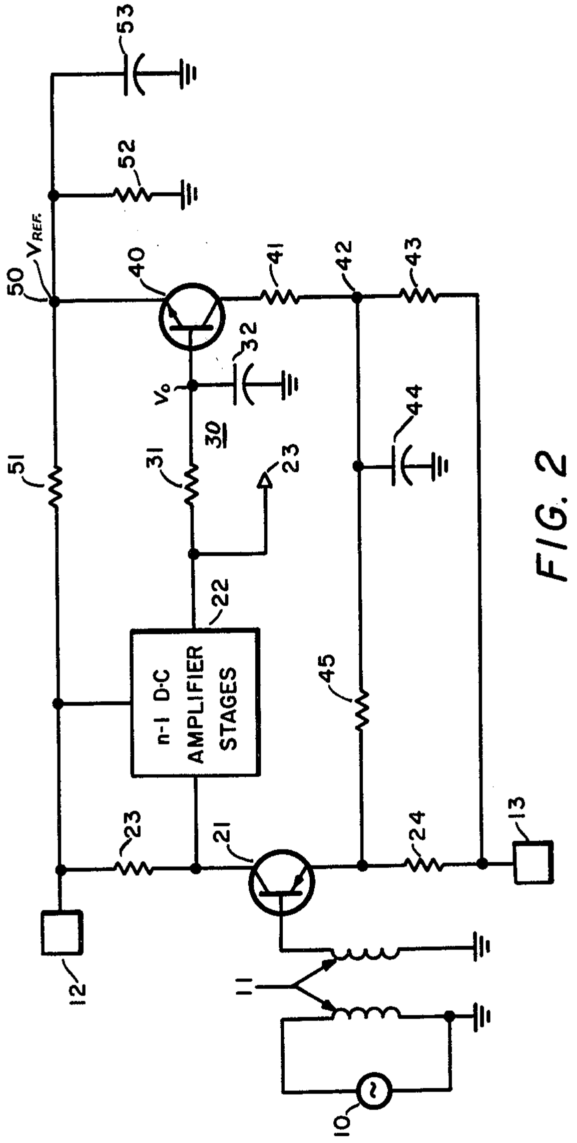
FIG. 2 is a diagrammatic representation of the amplifier of FIG. 1.

The operation of the system may be explained in more detail with reference to FIG. 2. Alternating current source 10 emits a signal which is coupled by transformer 11 into the first amplifier stage 21. This stage is a transistor amplifier whose collector is connected through resistor 23 to $V_{cc}$ source 12, which is a negative supply, and also to the base of the second amplifier stage which is series connected to N–2 other stages.

The direct current output drift of amplifier 20, with respect to temperature, is primarily a function of leakage current $I_{cbo}$ and $V_{be}$ variations in the amplifier stages. The low direct current resistance of the transformer secondary, however, presents an ideal path for $I_{cbo}$ leakage in stage 21, thus minimizing its undesirable effect on the amplified signal. Amplifier 20, whose amplification is represented as $|A|$, is comprised of input stage 21 and intermediate stages 22. Its output is derived at terminal 23.

The alternating component of this output signal is also transferred to low pass filter 30, which comprises resistor 31 and grounded capacitor 32. Since the direct current drawn by comparator transistor 40 is negligible, filter 30 places $V_o$ at the base of this transistor. A reference voltage at terminal 50 is connected to the emitter of transistor 40. This reference voltage is obtained by the voltage division of source 12 by resistor 52 in parallel with capacitor 53 to ground and resistor 51 to the source. The collector circuit of the comparator transistor includes a resistor 41 which is connected to feedback terminal 42. This terminal is also common to resistor 43 which is connected to source 13 and an R-C filter, comprising resistor 45 connected to the emitter of transistor 21 and grounded capacitor 44.

The voltage at terminal 42 follows the difference between $V_o$ and $V_{REF}$ and is converted to current by resistor 45, whence it is negatively fed back to the emitter of transistor 21 to eliminate drift in amplifier quiescent output voltage due to temperature variation and other causes.

In practice, the only finite detrimental effect to stabilization through the use of this invention is caused by leakage current in transistor 40. However, even this may be eliminated by the use of a difference amplifier (refer. Millman and Taub, supra, p. 20) to implement comparator 40 in which the temperature effects in one comparator transistor tend to cancel out those adverse effects in the other transistor.

The invention is not limited to the specifics of the preceding description of one illustrative embodiment, but embraces the full scope of the following claims.

What is claimed is:

1. A drift stabilized amplifier circuit comprising, means for generating an alternating current input signal, an amplifier having an input circuit and an output circuit, means coupling said input signal to said input circuit to produce an amplified output signal having a direct current component and an alternating current component, a filter connected to said output circuit and operative to pass only the direct current component of said output signal, a source of reference voltage, a comparator operative in response to said direct current component and said reference voltage to generate an inverted signal equal to the difference between said direct current component and said reference voltage, and feedback circuit means for applying said inverted signal to the input circuit of said amplifier to cancel variations in the quiescent operating level of said amplifier.

2. A drift stabilized amplifier circuit comprising, an amplifier having a first stage including a first transistor having base, emitter and collector electrodes, transformer means coupling the base electrode of said first transistor to a source of alternating current input signals, a first resistor connecting the collector of said first transistor to a source of negative potential, the collector of said first transistor also being the output terminal of said amplifier, a second resistor connecting the emitter of said first transistor to a source of positive potential, a comparator circuit including a second transistor having base, emitter and collector electrodes, an R-C direct current filter operative to reject alternating current signals connecting the collector of said first transistor to the base of said second transistor, means connecting the emitter of said second transistor to a source of reference potential, said second transistor being operative to produce at its collector a signal equal to the difference between said reference potential and the potential applied to its base, and means including an R-C low pass filter connecting the collector of said second transistor to the emitter of said first transistor to stabilize the quiescent operating level of said amplifier.

References Cited by the Examiner

UNITED STATES PATENTS

| | | | |
|---|---|---|---|
| 2,619,552 | 11/52 | Kerns | 330—9 |
| 2,741,668 | 4/56 | Iffland | 330—97 XR |

OTHER REFERENCES

Electronic And Radio Engineer, May 1957, pp. 161–165, article by J. S. Murray, "Transistor Bias Stabilization."

ROY LAKE, *Primary Examiner.*

ARTHUR GAUSS, *Examiner.*